United States Patent
Anthony

(10) Patent No.: US 8,115,662 B2
(45) Date of Patent: Feb. 14, 2012

(54) SAMPLER LINEARITY BY SIMULTANEOUS DERIVATIVE SAMPLING

(75) Inventor: Michael P. Anthony, Andover, MA (US)

(73) Assignee: Intersil Americas Inc., Milpitas, CA (US)

( * ) Notice: Subject to any disclaimer, the term of this patent is extended or adjusted under 35 U.S.C. 154(b) by 45 days.

(21) Appl. No.: 12/818,491

(22) Filed: Jun. 18, 2010

(65) Prior Publication Data

US 2011/0043392 A1 Feb. 24, 2011

Related U.S. Application Data

(60) Provisional application No. 61/308,851, filed on Feb. 26, 2010, provisional application No. 61/219,978, filed on Jun. 24, 2009.

(51) Int. Cl.
*H03M 1/00* (2006.01)

(52) U.S. Cl. .................. 341/122; 341/118; 341/155
(58) Field of Classification Search .............. 341/118, 341/122, 155
See application file for complete search history.

(56) References Cited

U.S. PATENT DOCUMENTS

| | | | |
|---|---|---|---|
| 4,985,702 A | 1/1991 | Penney | |
| 6,597,299 B1 * | 7/2003 | Bugeja | 341/122 |
| 6,982,664 B1 * | 1/2006 | Nairn | 341/118 |
| 7,142,137 B2 | 11/2006 | Batruni | |
| 7,808,408 B2 * | 10/2010 | Madisetti et al. | 341/118 |

OTHER PUBLICATIONS

Nikaeen, Parastoo and Murmann, Boris; "Digital Correction of Dynamic Track-and-Hold Errors Providing SFDR>83 dB up to $F_{in}$ =470 MHz", IEEE 2008 Custom Integrated Circuits Conference (CICC), IEEE Xplore, downloaded on Jan. 27, 2009, pp. 161-164.

Nikaeen, Parastoo and Murmann, Boris; "Digital Compensation of Dynamic Acquisition Errors at the Front-End of High-Performance A/D Converters", IEEE Journal of Selected Topics in Signal Processing, vol. 3, No. 3, Jun. 2009, pp. 499-508.

* cited by examiner

*Primary Examiner* — Khai M Nguyen
(74) *Attorney, Agent, or Firm* — Hamilton, Brook, Smith & Reynolds, P.C.

(57) ABSTRACT

A circuit for improved sampler linearity, in an analog to digital converter, by taking simultaneous analog samples of an input signal V(t) and its derivative, dV/dt. The correction can be implemented as a memoryless non-linear model in the analog, digital, or mixed signal domains. Delay elements placed in the clock signal path or main input signal path can provide more precise control over the correction.

25 Claims, 3 Drawing Sheets

SAMPLER LINEARITY BY SIMULTANEOUS DERIVATIVE SAMPLING

RELATED APPLICATIONS

This application claims the benefit of U.S. Provisional Application No. 61/308,851, filed on Feb. 26, 2010 and U.S. Provisional Application No. 61/219,978, filed on Jun. 24, 2009. The entire teachings of the above application(s) are incorporated herein by reference.

BACKGROUND

Switched-capacitor samplers of the general type used in, for example, the KAD5512P-50 12-bit, 500 Mega-Sample Per Second (MSPS) Analog-to-Digital Converter (ADC) available from Intersil Corporation can provide high performance and low-power consumption. However, these samplers sometimes suffer from degraded linearity at high input signal frequencies. Such high-frequency non-linearities can arise due to an input signal V(t) having a high derivative, (dV/dt).

One way in which a high input signal dV/dt can corrupt operation of such circuits is by imperfect bootstrapping of a series input switch that connects the sampler input to a plate ("top plate") of a sampling capacitor. Another way is due to charge loss from the other capacitor plate ("bottom plate"), as a result of forward biasing or undesired partial turn-on of an associated Field Effect Transistor (FET) switch.

To the degree that dV/dt-related effects cause distortion of the ADC output, it is possible to improve on the performance by acquiring information about input signal dV/dt at the instants when the signal V(t) samples are acquired, and then using this information to correct the ADC result.

Algorithms implementing such corrections have been demonstrated. One approach, as described in U.S. Pat. No. 7,142,137 to Batruni and assigned to Optichron, Inc. uses an estimate of dV/dt that is digitally reconstructed from the digital output of the ADC. This method suffers from digital complexity and power consumption, and from the necessity of assumptions and constraints regarding the input signal spectrum—specifically, an assumption is made concerning which Nyquist zone the input signal occupies.

Researchers at Stanford University have published papers describing digital post-correction of sampler nonlinearity also using digital dV/dt estimation, but with a more specific sampler model than Optichron's method. See Nikaeen, P. and Murmann, B., "Digital Correction of Dynamic Track-and-Hold Errors Providing SFDR>83 dB up to $f_{in}$=470 MHz, *IEEE* 2008 *Custom Integrated Circuits Conference* (2008) and is "Digital Compensation of Dynamic Acquisition Errors at the Front-end of High-Performance A/D Converters, *IEEE Journal of Selected Topics in Signal Processing*, Vol. 3. No. 3, June 2009, the entire contents of each of which are hereby incorporated by reference.

SUMMARY OF THE DISCLOSURE

An embodiment of an analog to digital converter described herein provides sampler linearity at high signal frequencies.

This is achieved through simultaneous sampling of both the input signal V(t) and input derivative signal dV/dt, with the latter generated by an analog circuit. The resulting simultaneous analog samples of the derivative are then used to correct non-linearity in the sampler by analog, digital, or mixed-signal signal processing circuits and/or programmed processes. Direct analog measurement of dV/dt at the very same sample instants as when the samples of V(t) are taken provides a more accurate input to such correction algorithms.

One possible way to acquire analog samples is to employ a second sampler operating simultaneously with the primary (input voltage) sampler. This second sampler takes as input an analog signal proportional to dV/dt of the input signal. A capacitor-resistor (C-R) network can provide such a signal proportional to the derivative in some instances, and may be sufficient for the needed correction depending upon input signal bandwidth. More elaborate circuits, either passive circuits or involving op-amps or other active circuitry, may provide improved dV/dt signals over a larger bandwidth.

The dV/dt samples can then be used directly as an input to an analog correction circuit. For example, the dV/dt samples may be combined with separately-acquired analog samples of the V(t) input signal in an analog signal-processing circuit, with the results added to the propagating analog residue of V(t) in the main ADC (assuming it is a pipelined ADC).

Alternatively, the dV/dt samples are processed in a mixed signal circuit, combining them with the most-significant few bits from the main (pipelined) ADC; the results of such computation would again be added to the propagating analog residue of V(t) in the main ADC.

In yet another approach, the dV/dt samples can also be separately A/D-converted, with the results being used as input for digital correction of the main ADC digital output. In this latter case, the ADC which handles the dV/dt samples can be of lower resolution than the main ADC, since the required corrections are much smaller than the main voltage signals themselves.

Thus, in general, correcting the operation of an ADC according to the teachings herein involves: generating a signal proportional to dV/dt, where V(t) is the sampler input signal; sampling the dV/dt signal at substantially the same instants when a main sampler captures samples of V(t); and using these dV/dt samples to correct the corresponding samples of V(t) such as through an analog correction process, and/or by using a second ADC combined with mixed signals and/or a purely digital correction process.

The advantages are (1) simplicity (2) potentially very low power and (3) on unambiguous dV/dt estimate (e.g., one that does not depend on apriori knowledge of the signal's frequency content).

The approach can be applied to undersampling applications.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF PREFERRED EMBODIMENTS

A description of example embodiments follows.

Figure 1:
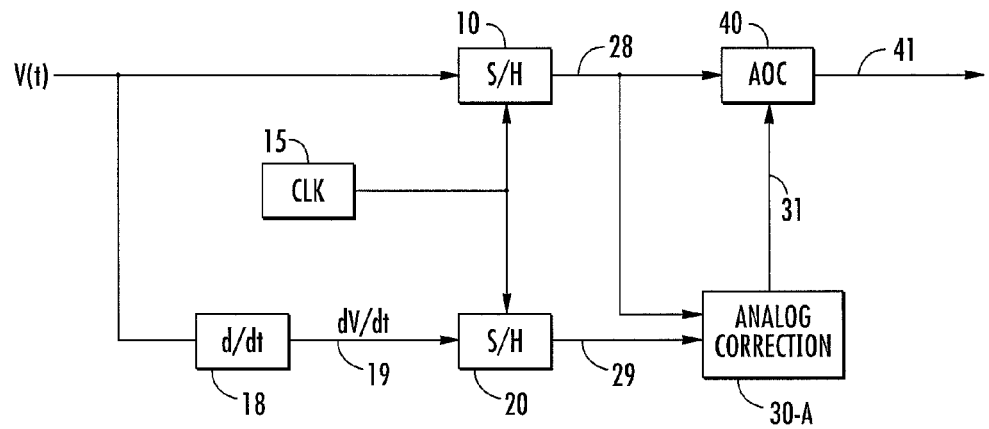
FIG. 1 is a block diagram of an ADC that uses a simultaneous derivative analog sampler and analog correction circuitry.

FIG. 1 is a block diagram of an Analog to Digital Converter (ADC) that uses direct analog measurement of dV/dt at sample instants of an input signal, V(t) to provide input to correct sample errors. In this first embodiment, a primary sampler 10 provides samples of the input signal, V(t), to be processed by a main analog to digital converter (ADC) core 40. Derivative information is acquired by employing a second sampler 20 operating simultaneously (e.g., using a common clock signal 15) with the primary (voltage-sampling) sampler 10. The input to sampler 20 is an analog signal 19 that is proportional to dV/dt of the input signal, V(t). A simple capacitor-resistor (C-R) network 18 can provide such an analog derivative signal 19 over a reasonable bandwidth, and may be sufficient for the needed correction. More elaborate circuits 18, either passive or involving op-amps or other active circuitry, may provide a more accurate dV/dt estimate over a larger bandwidth.

The dV/dt samples 29 generated by the second sampler 20 are then used directly as an input to analog correction 30-A of the primary samples 28. The corrected signal 31 is then applied to the ADC core 40 that generates the digital output signal 41.

Correction 30-A may implement any number of correction schemes to generate the corrected output signal 31. One suitable correction scheme is based on an assumption that the sampling network has sufficiently large bandwidth so that the derivative samples 29 will track the input signal samples 28 closely. This model is assumes that the C-R network can be expressed as a memoryless non-linear first order differential equation based on the input voltage V(t). Such a model can be expressed by the power series:

$$V_{in}(k) = V_{out}(k) + [a_0 + a_1 V_{out}(k) + a_2 V_{out}^2(k) + \ldots] \times \frac{dV_{out}(k)}{dt}$$

In this embodiment, the model is implemented using analog signal processing components to perform the additions and multiplications. More information on such a model as was applied to digital correction was contained in the aforementioned paper by Nikaeen, P. and Murmann, B., entitled "Digital Correction of Dynamic Track-and-Hold Errors Providing SFDR>83 dB up to $f_{in}$=470 MHz", *IEEE* 2008 *Custom Integrated Circuits Conference* (2008), which was already incorporated by reference herein.

The corrected input samples then may be combined with separately-acquired analog samples 28 of the V(t), such as by using the resulting corrected samples 31 as the input to, or add to any propagating analog residue of, V(t) in the main ADC 40 core (assuming it is a pipelined ADC). Examples of pipelined ADCs 40 that may used herein are described in a co-pending U.S. patent application by Anthony, M., entitled "Charge-Domain Pipelined Charge-Redistribution Analog-to-Digital Converter" Ser. No. 12/074,706 filed Mar. 5, 2008, the entire contents of which are hereby incorporated by reference in their entirety.

Figure 2:
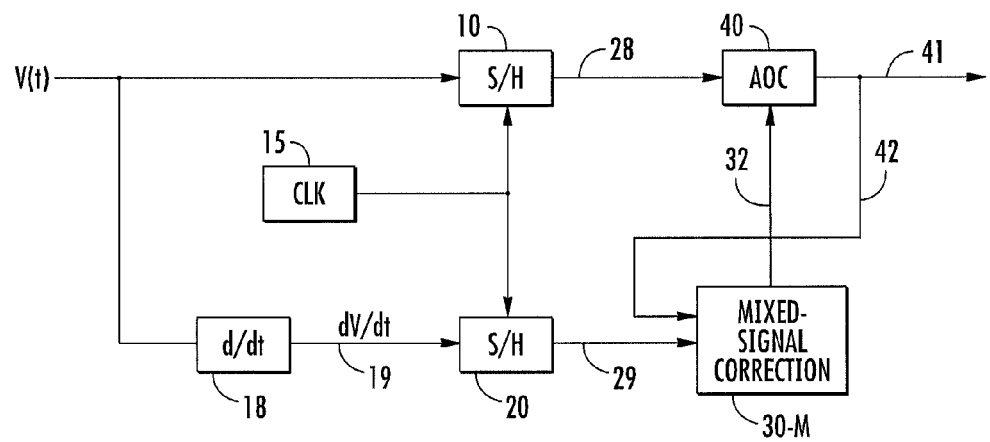
FIG. 2 is a block diagram of similar ADC including mixed-signal correction circuitry.

Alternatively, as shown in FIG. 2, the dV/dt samples 29 may be used for correction processing in a mixed signal circuit 30-M, combining them with the most-significant few bits 42 from the ADC 40. In this embodiment, the result 32 of such computation is then added to the propagating analog residue of V(t) in the main ADC 40. In such a mixed-signal implementation of the correction, the power series can be generated by a digital look-up table (LUT).

Figure 3:
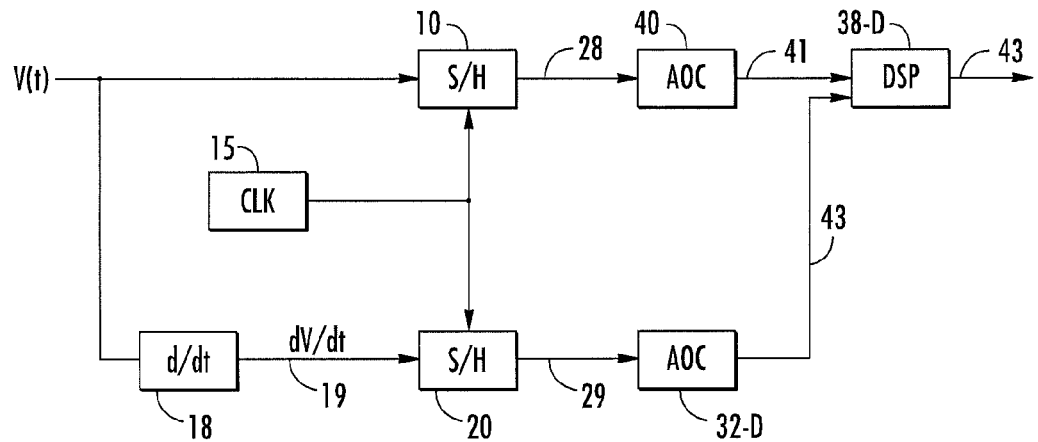
FIG. 3 is a block diagram of similar ADC including digital correction circuitry.

In a further embodiment, as shown in FIG. 3, the dV/dt samples 29 can be separately analog-to digital-converted via a second ADC 32-D. Here, the ADC results is 43 are used as input for purely digital correction of the main ADC digital output 41. In this case, the ADC 32-D which handles the dV/dt samples 29 can be of lower resolution than the main ADC 40, since the required corrections are much smaller in magnitude than the variations in the input signal. In such an implementation, a digital signal processor 38-D may implement the correction to output 41 of the main ADC 40.

Figure 4:
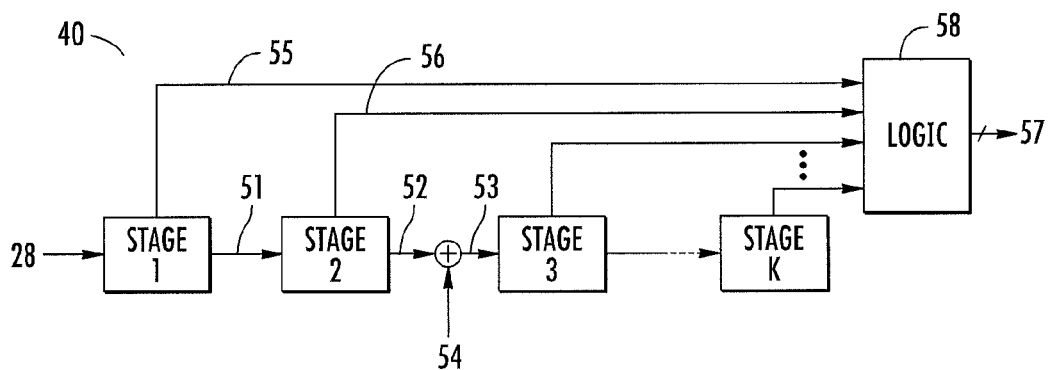
FIG. 4 is a block diagram of a pipeline ADC showing addition of the correction signal to a propagating analog residue value.

FIG. 4 shows an example of the addition of a correction signal 54 to the propagating analog residue within a pipelined ADC 40, as suggested for the embodiments of FIGS. 2 and 3. Here, the ADC 40 receives input signal samples 28 at a first stage 1, producing digital output 55 and analog residue 51. Residue signal 51 is further processed in a series of stages, producing respective digital outputs 56 etc. and successive analog residues 52 etc. The digital outputs are combined in logic block 58 to construct the final ADC digital output 57. The correction signal 54 (i.e., signal 32 or 43 generated as described above) is added to the propagating residue signal at some later stage of the ADC (with appropriate delays implied (but not shown) to ensure alignment of the corrections to the propagated residue). In this example, the correction signal 54 is added to residue 52 of stage 2 to produce modified residue 53, which is then processed by the remainder of the pipeline.

Figure 5:
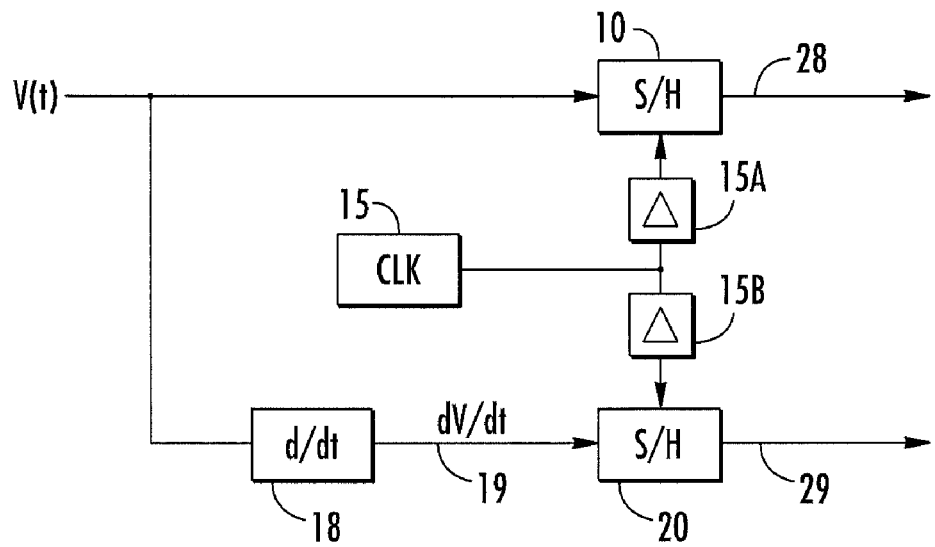
FIG. 5 is a block diagram of another implementation for the simultaneous V(t) and dV/dt sampling circuitry including circuitry for correcting signal delay.

FIG. 5 shows an alternative clock distribution method applicable to the sampling apparatus of FIGS. 1-4. Here, time-delay blocks 15A and 15B are inserted between the clock source 15 and the main sampler 10 and derivative sampler 20 respectively. Delay block 15A typically has a shorter delay than delay block 15B.

Figure 6:
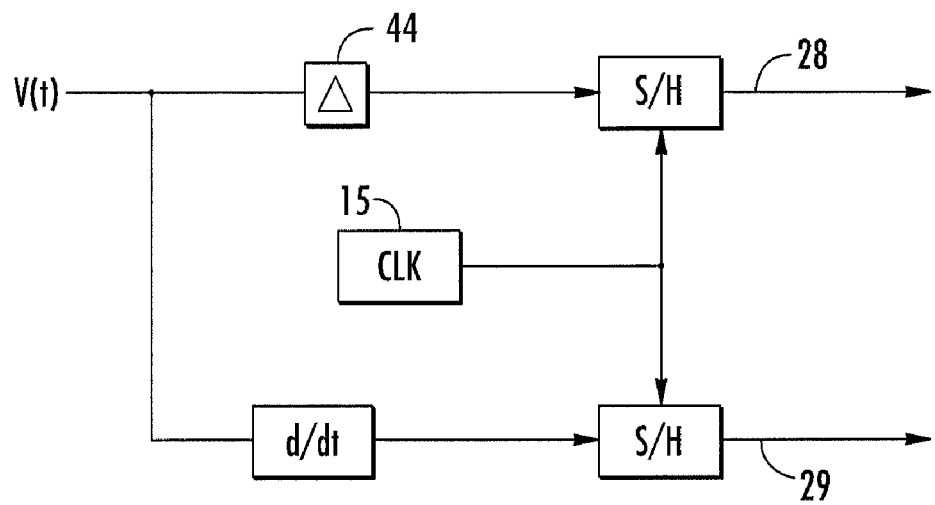
FIG. 6 is another approach for correcting signal delay.

In alternate embodiments, such as shown in FIG. 6, the same end result can be obtained by inserting delay(s) 44 in the main voltage signal path, such as between the input v(t) and the main sampler 10. In either approach, the extra delay blocks, wherever implemented, can provide more precise control over the effective sampling times of the respective samplers. This provides further correction for relative signal delays in the main input and derivative signal paths. Delay blocks for digital signals such as the clock signal are known, and can be made adjustable if necessary to accommodate fabrication process variation.

Thus in pertinent aspects the apparatus and method consists of:

a. a circuit 18 for generating a signal 19 proportional to dV/dt, where V(t) is the sampler 10 input signal;

b. a sample/hold circuit 20 which captures samples of the dV/dt signal at substantially the same instants when the main sampler 10 captures samples of V(t); and c. a correction circuit that uses the dV/dt samples to generate corrections to the corresponding samples of V(t); it being understood the correction can be implemented as an analog circuit, a mixed-signal circuit, or as a second ADC combined with digital correction circuitry.

In general it should be understood that many of the signal processing elements described herein may be embodied as discrete or integrated circuits, as analog, digital or mixed-signal implementations, as program code executing in a programmable digital processor, a combination of one or more of the same, or in other ways.

While this invention has been particularly shown and described with references to example embodiments thereof, it will be understood by those skilled in the art that various changes in form and details may be made therein without departing from the scope of the invention encompassed by the appended claims.

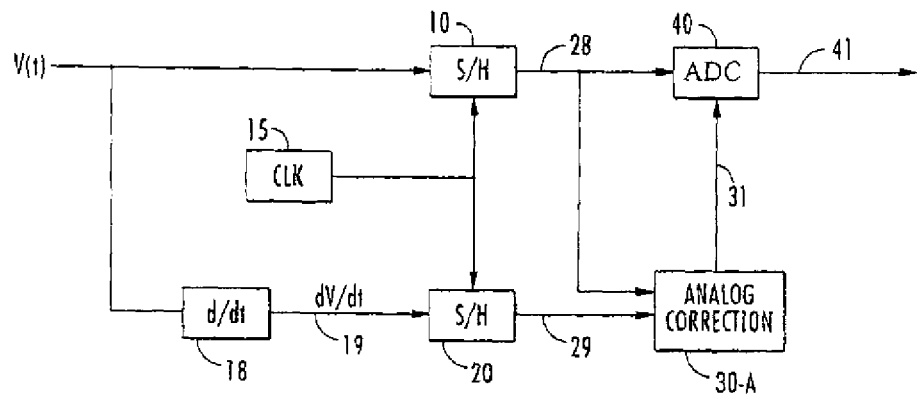

What is claimed is:

1. An analog to digital converter apparatus for converting an analog input signal, V(t), to a digital output signal comprising:
   a main sample/hold circuit, arranged to sample the analog input signal, V(t), and to provide samples thereof as a sampled input signal;
   an analog derivative circuit, for generating an analog derivative signal, dV/dt, corresponding to a derivative of the analog input signal, V(t);
   a second sample/hold circuit arranged to provide samples of the analog derivative signal dV/dt at instants in time corresponding to when the main sample/hold circuit provides the samples of V(t);
   a correction circuit, coupled to the main sample/hold circuit and coupled to the second sample/hold circuit, for using the samples of the analog derivative signal dV/dt to determine a correction signal; and
   a converter circuit, arranged to provide the digital output signal.

2. The apparatus of claim 1 wherein the converter circuit is a pipeline of two or more analog to digital converter stages.

3. The apparatus of claim 2 wherein the correction signal is coupled to an intermediate stage of the pipeline.

4. The apparatus of claim 1 wherein the correction circuit is an analog circuit coupled to the second sample/hold circuit to receive the samples of the analog derivative signal and to receive the sampled input signal as an analog signal to provide the correction signal;
   and wherein the converter circuit further comprises:
   an analog to digital converter core, arranged to receive the sampled input signal and the correction signal, and to provide the digital output signal.

5. The apparatus of claim 1 wherein the correction circuit is a mixed signal circuit coupled to the second sample/hold circuit to receive the samples of the analog derivative signal and the digital output signal, to provide the correction signal;
   and wherein the converter circuit further comprises:
   an analog to digital converter core, arranged to receive the sampled input signal and the correction signal, and to provide the digital output signal.

6. The apparatus of claim 1 wherein the correction circuit comprises a digital signal processing circuit;
   and wherein the converter circuit further comprises:
   a first analog to digital converter core, coupled to the main sample/hold circuit, and arranged to receive the sampled input signal and to provide a digitized main signal to the correction circuit; and
   a second analog to digital converter core, coupled to the second sample/hold circuit and arranged to receive the samples of the analog derivative signal, and to provide a digitized derivative signal to the correction circuit.

7. The apparatus of claim 1 wherein the correction circuit implements a memoryless non-linear model.

8. The apparatus of claim 7 wherein the memoryless non-linear model can be expressed by a power series of the form:

$$V_{in}(k) = V_{out}(k) + [a_0 + a_1 V_{out}(k) + a_2 V_{out}^2(k) + \ldots] \times \frac{dV_{out}(k)}{dt}.$$

9. The apparatus of claim 1 additionally comprising:
   a sample clock generator, for generating a common sample clock applied to the main sample/hold circuit and the second sample/hold circuit.

10. The apparatus of claim 9 additionally comprising:
    a clock delay circuit, arranged to receive the common sample clock and to generate a main clock signal for the main sample/hold circuit and a second clock signal for the second sample/hold circuit, the clock relative delay circuit adjusting the timing of the main and second clock signals to compensate for time delay in the derivative samples introduced by the analog derivative circuit.

11. The apparatus of claim 1 additionally comprising:
    a main sample delay circuit, disposed between the main sample/hold circuit and the correction circuit, to compensate for time delay in the derivative samples introduced by the analog derivative circuit.

12. The apparatus of claim 1 wherein the correction circuit is formed of analog signal processing components.

13. The apparatus of claim 1 wherein the correction circuit includes mixed analog and digital signal processing components.

14. The apparatus of claim 1 wherein the correction circuit further comprises a digital signal processor.

15. A method for converting an analog input signal, V(t), to a digital output signal comprising:
    generating, in the analog signal domain, a derivative signal representing a derivative, dV/dt, of the analog input signal;
    sampling the analog input signal, V(t), to provide analog input signal samples thereof at sample times determined by an input clock signal;
    sampling the analog derivative signal to provide analog derivative samples at sample times also determined by the same input clock signal;
    correcting samples of the analog input signal using the derivative samples; and
    converting, the samples of the analog input signal to provide the digital output signal.

16. The method of claim 15 wherein the converting step is performed in multiple stages of a pipelined analog to digital converter.

17. The method of claim 16 wherein the step of correcting samples of the analog input signal is performed at an intermediate stage of the pipelined analog to digital converter.

18. The method of claim 15 wherein the correcting step is performed in an analog circuit coupled to the second sample/hold circuit to receive the samples of the analog derivative signal and to receive the sampled input signal as an analog signal to provide the correction signal;
    and wherein the converting step further comprises:
    analog to digital converting the sampled input signal using the correction signal, to provide the digital output signal.

19. The method of claim 15 wherein the correcting step is performed in a mixed signal circuit coupled to the second sample/hold circuit to receive the samples of the analog derivative signal and the digital output signal, to provide the correction signal;

and wherein the converting step further comprises:
analog to digital converting the sampled input signal using the correction signal, and to provide the digital output signal.

20. The method of claim 15 wherein the correcting step is performed in a digital signal processing circuit;

and wherein the converting step further comprises:
a first analog to digital converting step of converting the sampled input signal to provide a digitized main signal to the correcting step; and
a second analog to digital converting step of converting the samples of the analog derivative signal, and to provide a digitized derivative signal to the correcting step.

21. The method of claim 15 wherein the correcting step implements a memoryless non-linear model.

22. The method of claim 21 wherein the memoryless non-linear model is expressed by a power series of the form:

$$V_{in}(k) = V_{out}(k) + [a_0 + a_1 V_{out}(k) + a_2 V_{out}^2(k) + \ldots] \times \frac{dV_{out}(k)}{dt}.$$

23. The method of claim 15 additionally comprising:
compensating for relative time delay between the analog input signal samples and analog derivative samples.

24. The method of claim 15 wherein the correcting step is carried via analog signal processing steps.

25. The method of claim 15 wherein the correcting step is carried out as mixed analog and digital signal processing steps.

* * * * *

UNITED STATES PATENT AND TRADEMARK OFFICE
CERTIFICATE OF CORRECTION

| | | |
|---|---|---|
| PATENT NO. | : 8,115,662 B2 | Page 1 of 3 |
| APPLICATION NO. | : 12/818491 | |
| DATED | : February 14, 2012 | |
| INVENTOR(S) | : Anthony | |

It is certified that error appears in the above-identified patent and that said Letters Patent is hereby corrected as shown below:

Title page

Delete Title page, and replace with new Title page. (attached)

In the Drawings

At sheet 1 of 3, please substitute Fig. 1, shown below:

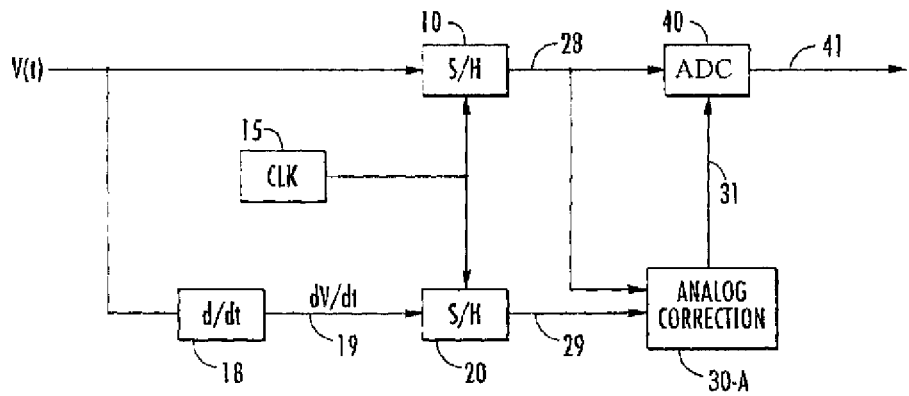

FIG. 1

Signed and Sealed this
Eighteenth Day of February, 2014

Michelle K. Lee
*Deputy Director of the United States Patent and Trademark Office*

CERTIFICATE OF CORRECTION (continued)
U.S. Pat. No. 8,115,662 B2

At sheet 1 of 3, please substitute Fig. 2, shown below:

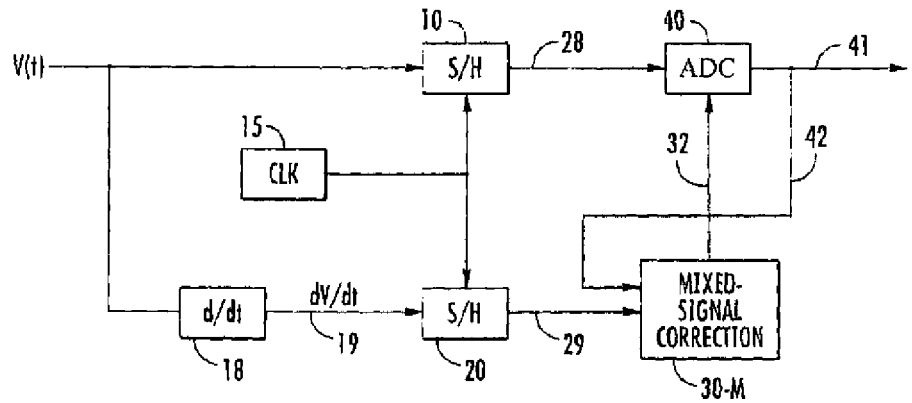

FIG. 2

At sheet 2 of 3, please substitute Fig. 3, shown below:

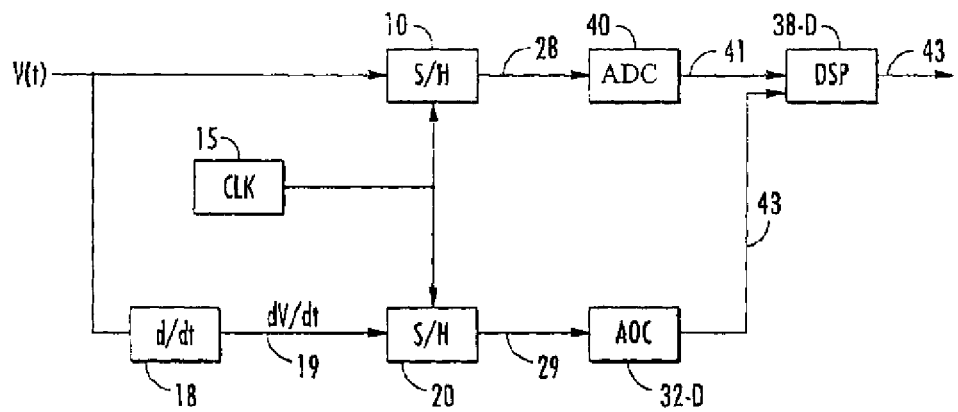

FIG. 3

United States Patent
Anthony

(12) 
(10) Patent No.: US 8,115,662 B2
(45) Date of Patent: Feb. 14, 2012

(54) SAMPLER LINEARITY BY SIMULTANEOUS DERIVATIVE SAMPLING

(75) Inventor: Michael P. Anthony, Andover, MA (US)

(73) Assignee: Intersil Americas Inc., Milpitas, CA (US)

( * ) Notice: Subject to any disclaimer, the term of this patent is extended or adjusted under 35 U.S.C. 154(b) by 45 days.

(21) Appl. No.: 12/818,491

(22) Filed: Jun. 18, 2010

(65) Prior Publication Data

US 2011/0043392 A1 Feb. 24, 2011

Related U.S. Application Data

(60) Provisional application No. 61/308,851, filed on Feb. 26, 2010, provisional application No. 61/219,978, filed on Jun. 24, 2009.

(51) Int. Cl.
*H03M 1/00* (2006.01)

(52) U.S. Cl. ........................ 341/122; 341/118; 341/155

(58) Field of Classification Search ............... 341/118, 341/122, 155
See application file for complete search history.

(56) References Cited

U.S. PATENT DOCUMENTS

| | | | |
|---|---|---|---|
| 4,985,702 A | 1/1991 | Penney | |
| 6,597,299 B1 * | 7/2003 | Bugeja | 341/122 |
| 6,982,664 B1 * | 1/2006 | Nairn | 341/118 |
| 7,142,137 B2 | 11/2006 | Batruni | |
| 7,808,408 B2 * | 10/2010 | Madisetti et al. | 341/118 |

OTHER PUBLICATIONS

Nikaeen, Parastoo and Murmann, Boris; "Digital Correction of Dynamic Track-and-Hold Errors Providing SFDR>83 dB up to $F_{in}$ =470 MHz", IEEE 2008 Custom Integrated Circuits Conference (CICC), IEEE Xplore, downloaded on Jan. 27, 2009, pp. 161-164.

Nikaeen, Parastoo and Murmann, Boris; "Digital Compensation of Dynamic Acquisition Errors at the Front-End of High-Performance A/D Converters", IEEE Journal of Selected Topics in Signal Processing, vol. 3, No. 3, Jun. 2009, pp. 499-508.

* cited by examiner

*Primary Examiner* — Khai M Nguyen
(74) *Attorney, Agent, or Firm* — Hamilton, Brook, Smith & Reynolds, P.C.

(57) ABSTRACT

A circuit for improved sampler linearity, in an analog to digital converter, by taking simultaneous analog samples of an input signal V(t) and its derivative, dV/dt. The correction can be implemented as a memoryless non-linear model in the analog, digital, or mixed signal domains. Delay elements placed in the clock signal path or main input signal path can provide more precise control over the correction.

25 Claims, 3 Drawing Sheets